US012796306B2

(12) United States Patent
Park et al.

(10) Patent No.: US 12,796,306 B2
(45) Date of Patent: Nov. 10, 2026

(54) APPARATUS FOR FABRICATING DISPLAY PANEL AND METHOD FOR FABRICATING THE SAME

(71) Applicant: Samsung Display Co., LTD., Yongin-si (KR)

(72) Inventors: Kyong Tae Park, Yongin-si (KR); Tae Young Kim, Yongin-si (KR); Dong So Kim, Yongin-si (KR); Jung Suk Bae, Yongin-si (KR); Sang Hoon Lim, Yongin-si (KR); Jong Chan Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 496 days.

(21) Appl. No.: 18/376,823

(22) Filed: Oct. 4, 2023

(65) Prior Publication Data

US 2024/0276858 A1 Aug. 15, 2024

(30) Foreign Application Priority Data

Feb. 10, 2023 (KR) ........................ 10-2023-0017985

(51) Int. Cl.
*H10K 71/70* (2023.01)
*H10P 74/20* (2026.01)

(52) U.S. Cl.
CPC ........... *H10K 71/70* (2023.02); *H10P 74/207* (2026.01)

(58) Field of Classification Search
CPC ....... H10K 71/70; H10P 74/207; H10P 74/23; H10D 86/021; G01R 31/2825;
(Continued)

(56) References Cited

U.S. PATENT DOCUMENTS 5,761,481 A * 6/1998 Kadoch .................... G06F 30/23 703/2
8,875,070 B2 * 10/2014 Bell ...................... G06F 30/398 716/132

(Continued)

FOREIGN PATENT DOCUMENTS

KR 20150034069 A 4/2015
KR 1020210136962 11/2021

(Continued)

*Primary Examiner* — Tung S Lau
(74) *Attorney, Agent, or Firm* — CANTOR COLBURN LLP

(57) ABSTRACT

An apparatus for fabricating a display panel includes: a sample module in which a switching transistor is formed, a measurement module having input/output terminals electrically connected to the switching transistor of the sample module, a characteristic detecting unit configured to detect primary operation characteristic information including an output current, an output voltage value and a threshold voltage range of the switching transistor, a model learning unit configured to correct at least one of the output current, the output voltage value and the threshold voltage range in the primary operation characteristic information using a learning program included in at least one learning model, and to extract correction results as learning result data, and a correction learning unit configured to classify the learning result data containing the primary operation characteristic information according to fabrication characteristics of sample switching transistors and a list of classifications.

20 Claims, 14 Drawing Sheets

(58) Field of Classification Search
CPC .............. G01R 19/12; G01R 19/16566; G01R 31/2621; G01R 31/2837; G01R 35/007; G06N 3/02; G09G 3/006; G09G 3/32
See application file for complete search history.

(56) References Cited

U.S. PATENT DOCUMENTS

| | | | | |
|---|---|---|---|---|
| 9,818,345 | B2 | 11/2017 | Shim et al. | |
| 9,922,977 | B2 * | 3/2018 | Arghavani | H10D 30/0217 |
| 11,157,817 | B2 | 10/2021 | Rolfe | |
| 2014/0095140 | A1 * | 4/2014 | Weir | G06F 30/20 703/14 |
| 2016/0104411 | A1 * | 4/2016 | Nathan | G09G 3/3283 345/77 |
| 2021/0055352 | A1 | 2/2021 | Takahashi et al. | |

FOREIGN PATENT DOCUMENTS

| | | | |
|---|---|---|---|
| KR | 102362159 | | 2/2022 |
| WO | 2019175707 | A1 | 9/2019 |

* cited by examiner

APPARATUS FOR FABRICATING DISPLAY PANEL AND METHOD FOR FABRICATING THE SAME

This application claims priority to Korean Patent Application No. 10-2023-0017985, filed on Feb. 10, 2023, and all the benefits accruing therefrom under 35 U.S.C. § 119, the content of which in its entirety is herein incorporated by reference.

BACKGROUND

1. Field of the Disclosure

The present disclosure relates to an apparatus and a method for fabricating a display panel.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

A display device may be a flat panel display device such as a liquid-crystal display device, a field emission display device, and an organic light-emitting display device. Among such a flat panel display device, each of the pixels of the display panel of an organic light-emitting display device includes light-emitting elements that can emit light by themselves.

The pixels of the display panel include light-emitting elements and pixel driving circuits that control the emission operation of the light-emitting elements. The pixel driving circuits include a plurality of switching transistors. The pixel driving circuits can precisely control the switching transistors and the light-emitting elements according to driving characteristics of each of the switching transistors, for example, operating voltage, electric current, and threshold voltage characteristics. Therefore, it is desirable for fabrication apparatus for quickly and accurately detecting driving characteristics of switching transistors applied to pixel driving circuits and easily applying them to display panels.

SUMMARY

Aspects of the present disclosure provide an apparatus for fabricating a display panel that can accurately detect driving characteristics of switching transistors using a primary learning model that removes noise during encoding and decoding processes, and a method for fabricating the same.

Aspects of the present disclosure also provide an apparatus for fabricating a display panel that can more accurately detect driving characteristics of switching transistors and can create a database by inputting the learning result data of the primary learning model and actually measured overall values as input values to a secondary learning model.

It should be noted that aspects of the present disclosure are not limited to the above-mentioned aspect; and other aspects of the present disclosure will be apparent to those skilled in the art from the following descriptions.

According to an embodiment of the disclosure, an apparatus for fabricating a display panel includes: a sample module in which a switching transistor is formed, a measurement module having input/output terminals electrically connected to the switching transistor of the sample module, a characteristic detecting unit configured to detect primary operation characteristic information including an output current, an output voltage value and a threshold voltage range of the switching transistor, a model learning unit configured to correct at least one of the output current, the output voltage value and the threshold voltage range in the primary operation characteristic information using a learning program included in at least one learning model, and to extract correction results as learning result data, and a correction learning unit configured to classify the learning result data containing the primary operation characteristic information according to fabrication characteristics of sample switching transistors and a list of classifications.

In an embodiment, the apparatus for fabricating the display panel may further include a database configured to store the primary operation characteristic information for the switching transistor formed in the sample module, and to create a database of the primary operation characteristic information according to the list of classifications including type of the switching transistor, channel size, and applied panel model, a first monitoring unit configured to display the primary operation characteristic information for each switching transistor as images or graphics on a monitor, and a second monitoring unit configured to, after the primary operation characteristic information is interpolated by encoding, decoding, compression and interpolation process, display correction results of interpolated learning result data and parameter data as graphics.

In an embodiment, the characteristic detecting unit may provide a gate voltage with a variable voltage level to a gate electrode of the switching transistor and a source voltage to a source electrode of the switching transistor, and accumulatively detect changes in a level of a drain voltage output from a drain electrode of the switching transistor relative to a level of the source voltage and a variable range of the gate voltage to detect the primary operation characteristic information containing drain voltage values.

In an embodiment, the model learning unit may apply a predetermined list of classifications and classification information containing the channel type and channel size of the switching transistor, and applied panel model information as primary learning parameters of the learning program, and performs the learning program of the primary learning model including the encoding, the decoding, the compression and the interpolation process using the source voltage value of the switching transistor, the gate voltage value, the variable range of the gate voltage, the output voltage value of the drain electrode, the output current, and the threshold voltage range as variables.

In an embodiment, the model learning unit may perform a secondary learning program using the primary operation characteristic information interpolated according to the results of the first learning program, the primary learning parameters, cumulative operation characteristic information of the switching transistor as variables for the secondary learning program, and output the secondary operation characteristic information on the switching transistor derived by a learning program of a secondary learning model of the least one learning model as secondary learning result data.

In an embodiment, the correction learning unit may compare the first operation characteristic information extracted by running a learning program of a first learning model with the second operation characteristic information extracted by running the secondary learning program, and correct parameter data or parameter input values of the primary or secondary learning program according to comparison results.

In an embodiment, the correction learning unit may compare the first operation characteristic information extracted through the learning program of the primary learning model of the at least one learning model with the secondary operation characteristic information extracted through the secondary learning program, and correct the source voltage value, the gate voltage value, the variable range of gate voltage of the switching transistor input to the primary or secondary learning program so that a difference between the primary operation characteristic information and the secondary operation characteristic information is minimized based on comparison results.

In an embodiment, the model learning unit may use a source voltage value of the switching transistor, a gate voltage value of the switching transistor, a variable range of gate voltage, an output voltage value of the drain electrode, an output current and a threshold voltage range sampled from the characteristic detecting unit as variables, to perform a learning program of a primary learning model including encoding, decoding, compression and interpolation process.

In an embodiment, the model learning unit may include a parameter input configured to receive channel type, channel size of the switching transistor, and applied panel model information as respective parameter data, and store a source voltage value, a gate voltage value, a variable range of gate voltage of the switching transistor, a sampled output voltage value of the drain electrode, output current, threshold voltage range information as variables, a first bit converter configured to convert the parameter data and the variables into a predetermined bit unit according to the learning model, a first data aligner configured to align the parameter data and variables converted into bits according to normalization information of each learning model, a primary learning model configured to perform primary learning with a primary learning program and extract the primary operation characteristic information containing output voltage values and threshold voltage range of the switching transistor as primary learning result data, and a secondary learning model configured to perform secondary learning with a secondary learning program to extract secondary operation characteristic information with corrected output voltage values and threshold voltage range as secondary learning result data.

In an embodiment, the primary learning model may use the parameter data and the variables to perform learning with the learning program of the primary learning model containing the encoding, the decoding, the compression and the interpolation process, and interpolate the sampled output voltage values of the drain electrode to extract the primary operation characteristic information containing the interpolated output voltage values of the drain electrode and threshold voltage range as the primary learning result data.

In an embodiment, the primary first learning model may include, a variable input portion configured to store variables including the parameter data and the sampled output voltage values of the drain electrode as variables for the primary learning program; an encoding learning portion configured to encode the variables separately for each parameter data, a data learning portion configured to compares the input voltage values and current values contained in the encoded variables sequentially, perform loss compression that has the values in a similar range belong to certain values based on comparison results, and store them in a predetermined latent space, a decoding learning portion configured to decode the input voltage values and current values stored in the latent space according to a list of classifications of the parameter data, and decode to output the output voltage values of the drain electrode separately, and an interpolation learning portion configured to extracting values between the output voltage values of the drain electrode output from the decoding learning unit, interpolate the values between the output voltage values of the drain electrode, and extract the primary operation characteristic information containing the interpolated output voltage values of the drain electrode and threshold voltage range as the primary learning result data.

In an embodiment, the secondary learning model may read the output voltage values and current value of the drain electrode, and threshold voltage range information that have been accumulated as a result of the detection of the primary operation characteristic information as cumulative operation characteristic information and sets it as cumulative variables, and use the cumulative variables and the primary operation characteristic information as variables to perform the secondary learning program.

In an embodiment, the secondary learning model may have the output voltage values and the current values in a predetermined similar range belong to the same value or substitute them with an average value, compresses and then decompress them, and outputs the decompressed output voltage values of the drain electrode and the threshold voltage range as the secondary operation characteristics information.

In an embodiment, the secondary learning model may use cumulative operation characteristic information on the switching transistors accumulated as a result of the detection of the primary operation characteristic information and the primary operation characteristic information as variables for a predetermined learning model to perform the secondary learning program, and extract the secondary operation characteristic information in which the output voltage values of the drain electrode and the threshold voltage range are corrected as the secondary learning result data.

According to an embodiment of the disclosure, a method for fabricating a display panel, includes: forming at least one switching transistor in a sample module, electrically connecting the at least one switching transistor in the sample module with input/output terminals in a measurement module, detecting, by a characteristic detecting unit, primary operation characteristic information including an output current, an output voltage value and a threshold voltage range of the at least one switching transistor, using at least one learning program for each learning model in a model learning unit to correct at least one of the output current, the output voltage value and the threshold voltage range in the primary operation characteristic information and extracting correction results as learning result data; and classifying, by a correction learning unit, the learning result data obtained by interpolating the primary operation characteristic information according to fabrication characteristics of sample switching transistors and a list of classifications to store the classified learning result data.

In an embodiment, the method for fabricating the display panel may further include: storing the primary operation characteristic information for each switching transistor of the at least one switching transistor formed in the sample module, and creating a database of the primary operation characteristic information according to a list of classifications including type of each switching transistor, channel size, and applied panel model, displaying the primary operation characteristic information including a change in amount of output current, a change in level of output voltage and threshold voltage range for each switching transistor as images or graphics on a monitor, and displaying correction results of learning result data and parameter data including the primary operation characteristic information as graphics.

In an embodiment, the detecting, by the characteristic detecting unit, the primary operation characteristic information may include providing a gate voltage with a variable voltage level to a gate electrode of each switching transistor, providing a source voltage to a source electrode, and accumulatively detecting changes in a level of a drain voltage output from a drain electrode of each switching transistor relative to a level of the source voltage and a variable range of the gate voltage to detect the primary operation characteristic information containing drain voltage values.

In an embodiment, the extracting the correction results as the learning result data may include applying a predetermined list of classifications and classification information containing the channel type and channel size of each switching transistor, and applied panel model information as primary learning parameters of the learning program, and performing the learning program of the primary learning model including the encoding, the decoding, the compression and the interpolation process using the source voltage value of each switching transistor, the gate voltage value, the variable range of the gate voltage, the output voltage value of the drain electrode, the output current, and the threshold voltage range as variables.

In an embodiment, the extracting the correction results as the learning result data may further include performing a second learning program using the primary operation characteristic information interpolated according to the results of the first learning program, the primary learning parameters, cumulative operation characteristic information of each switching transistor as variables for the secondary learning program, and outputting the secondary operation characteristic information on each switching transistor derived by a learning program of the secondary learning model as secondary learning result data.

In an embodiment, the extracting the correction results as the learning result data may include receiving channel type, channel size of each switching transistor, and applied panel model information as respective parameter data, and storing a source voltage value, a gate voltage value, a variable range of gate voltage of each switching transistor, a sampled output voltage value of the drain electrode, output current, threshold voltage range information as variables in a parameter input, converting the parameter data and the variables into a predetermined bit unit according to the learning model, aligning the parameter data and variables converted into bits according to normalization information of each learning model, performing primary learning with a primary learning program and extracting the primary operation characteristic information containing output voltage values and threshold voltage range of each switching transistor as primary learning result data, and performing second learning with a second learning program to extract secondary operation characteristic information with corrected output voltage values and threshold voltage range as secondary learning result data.

According to embodiments of the present disclosure, noise can be removed using a deep learning model, and driving characteristics of switching transistors formed in the display panel can be accurately detected.

In addition, according to embodiments of the present disclosure, the driving characteristics of switching transistors can be simply and easily detected using the sampled measurement values, and the driving characteristics of the switching transistors can be established as a database accurately for their unique characteristic.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, element.

Hereinafter, embodiments of the present disclosure will be described with reference to the accompanying drawings.

Figure 1:
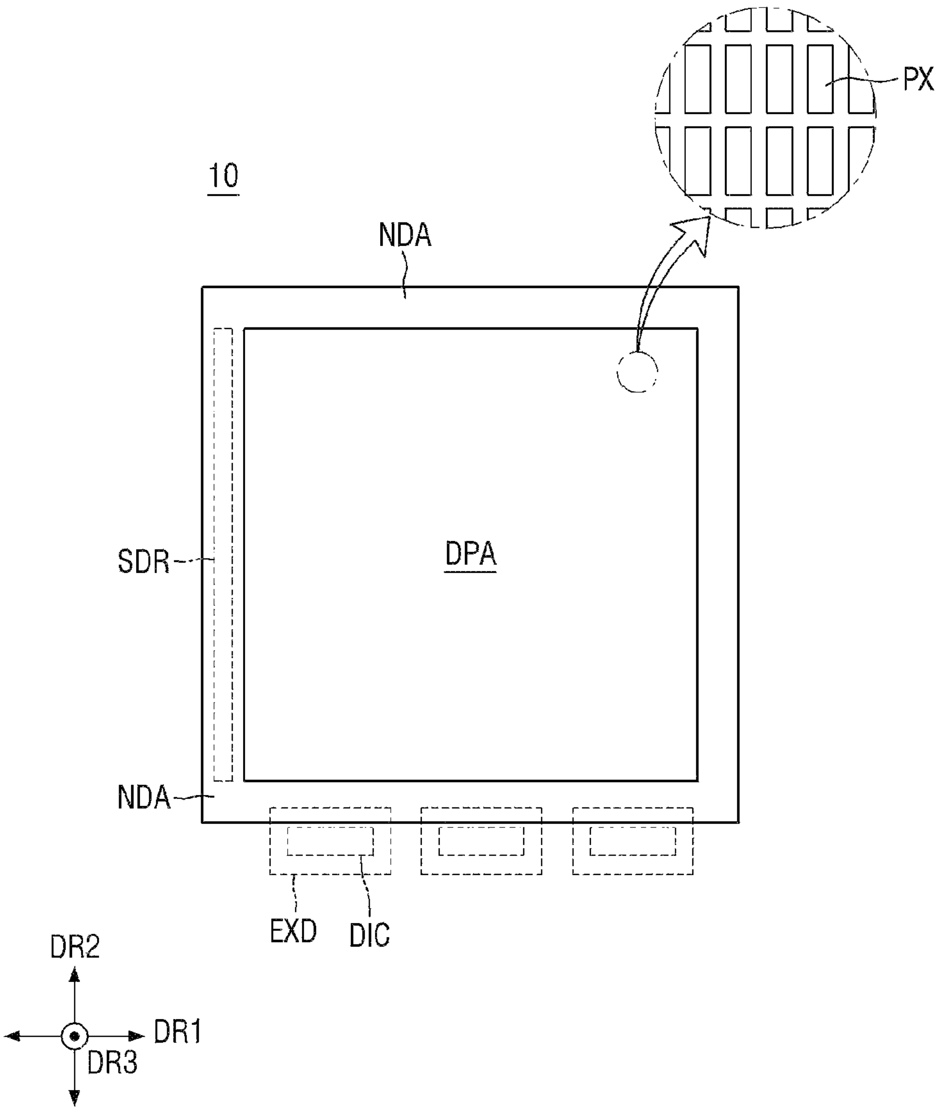
FIG. 1 is a plan view of a display device according to an embodiment of the present disclosure.

FIG. 1 is a plan view of a display device according to an embodiment of the present disclosure.

A display device 10 according to an embodiment of the present disclosure may be applied to, a smart phone, a mobile phone, a tablet PC, a personal digital assistant ("PDA"), a portable multimedia player ("PMP"), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various home appliances such as a refrigerator and a laundry machine, Internet of things ("IoT") devices, etc. In the following description, a television is described as an example of the display device. TV may have a high resolution or ultra high resolution such as HD, UHD, 4K and 8K.

In addition, the display device 10 according to the embodiments may be variously classified by the way in which images are displayed. Examples of the classification of display devices may include an organic light-emitting display device ("OLED"), an inorganic light-emitting display device ("inorganic EL"), a quantum-dot light-emitting display device ("QED"), a micro LED display device ("micro-LED"), a nano LED display device ("nano-LED"), a plasma display device ("PDP"), a field emission display device ("FED") and a cathode ray display device ("CRT"), a liquid-crystal display device ("LCD"), an electrophoretic display device ("EPD"), etc. In the following description, a micro LED display device will be described as an example of the display device 10. The micro LED display device will be simply referred to as a display device unless it is necessary to distinguish between them. It should be understood, however, that the embodiments of the present disclosure are not limited to the micro LED display devices, and any other display device listed above or well known in the art may be employed without departing from the scope of the present disclosure.

According to an embodiment of the present disclosure, the display device 10 may have a circular, elliptical or quadrangular shape, e.g., a square shape when viewed from the top. When the display device 10 is a television, it may have a rectangular shape in which the longer sides are located in the horizontal direction. It should be understood, however, that the present disclosure is not limited thereto. The longer side may be positioned in the vertical direction. Alternatively, the display device 10 may be installed rotatably so that the longer sides are positioned in the horizontal or vertical direction variably.

The display device 10 may include a display area DPA and a non-display area NDA. The display area DPA may be an active area where images are displayed. The display area DPA may have, but is not limited to, a square shape similar to the general shape of the display device 10 when viewed from the top. It may have a circular shape or an elliptical shape.

The display area DPA may include a plurality of pixels PX. The plurality of pixels PX may be arranged in a matrix. The shape of each of the pixels PX may be, but is not limited to, a rectangle or a square when viewed from the top. Each of the pixels PX may have a diamond shape having sides inclined with respect to a side of the display device 10. The plurality of pixels PX may include different color pixels PX. In an embodiment, for example, the plurality of pixels PX may include a red first color pixel PX, a green second color pixel PX, and a blue third color pixel PX. It should be understood, however, that the present disclosure is not limited thereto. The plurality of pixels PX may further include a white fourth color pixel PX. The color pixels PX may be arranged alternately in a RGB stripe pattern or a Pentile™ matrix.

The non-display area NDA may be disposed around the display area DPA. The non-display area NDA may surround the display area DPA entirely or partially. The display area DA may have a variety of shapes such as a circle and a square. The non-display area NDA may surround the display area DPA conforming to the shape of the display area DPA. The non-display area NDA may form the bezel of the display device 10.

In the non-display areas NDA, a driving circuit or a driving element for driving the display area DPA may be disposed. According to an embodiment of the present disclosure, pad areas may be located on the display substrate of the display device 10 in the non-display area NDA adjacent to a first side (the lower side in FIG. 1) of the display device 10, and external devices EXD may be mounted on pad electrodes of the pad areas. Examples of the external devices EXD may include a connection film, a printed circuit board, a driver chip DIC, a connector, a line connection film, etc. A scan driver SDR formed directly on the display substrate of the display device 10 or the like may be disposed in the non-display area NDA adjacent to a second side (the left side in FIG. 1) of the display device 10.

Figure 2:
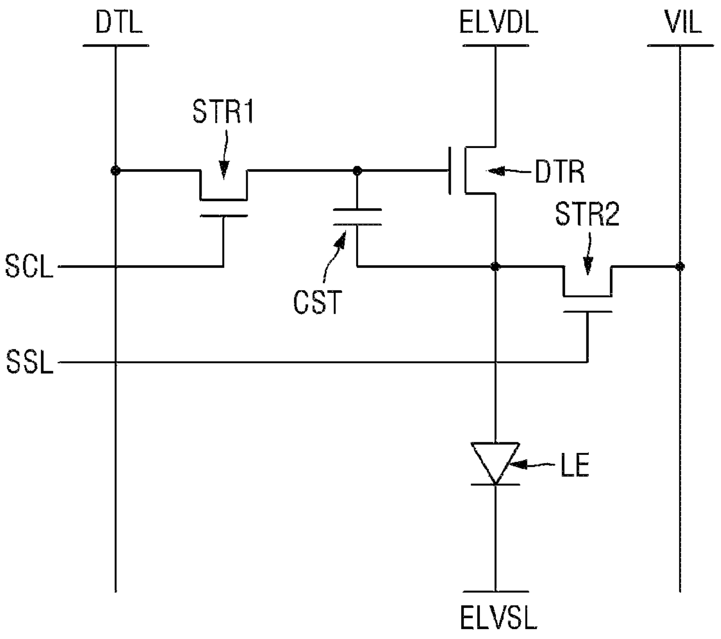
FIG. 2 is an equivalent circuit diagram of each of pixels according to an embodiment of the present disclosure.

FIG. 2 is an equivalent circuit diagram of each of pixels according to an embodiment of the present disclosure.

Referring to FIG. 2, each of the pixels PX may include three transistors DTR, STR1 and STR2 and one storage capacitor CST for allowing the light-emitting elements LE to emit light. The driving transistor DTR adjusts a current flowing from the first supply voltage line ELVDL from which the first supply voltage is applied to one light-emitting element LE according to the voltage difference between a gate electrode and a source electrode. The gate electrode of the driving transistor DTR may be connected to a first electrode of the first transistor ST1, the source electrode may be connected to a first electrode of one light-emitting element LE, and the drain electrode may be connected to the first supply voltage line ELVDL from which the first supply voltage is applied.

The first transistor STR1 is turned on by a scan signal of a scan line SCL to connect a data line DTL with the gate electrode of the driving transistor DTR. A gate electrode of the first transistor STR1 may be connected to the scan line SCL, the first electrode thereof may be connected to the gate electrode of the driving transistor DTR, and a second electrode thereof may be connected to the data line DTL.

The second transistor STR2 may be turned on by a sensing signal of a sensing signal line SSL to connect the initialization voltage line VIL to the source electrode of the driving transistor DTR. A gate electrode of the second transistor ST2 may be connected to the sensing signal line SSL, a first electrode thereof may be connected to the initialization voltage line VIL, and a second electrode thereof may be connected to the source electrode of the driving transistor DTR.

According to an embodiment of the present disclosure, the first electrode of each of the first and second transistors STR1 and STR2 may be a source electrode while the second electrode thereof may be a drain electrode. It is, however, to be understood that the present disclosure is not limited thereto. The first electrode of each of the first and second switching transistors STR1 and STR2 may be a drain electrode while the second electrode thereof may be a source electrode.

Figure 4:
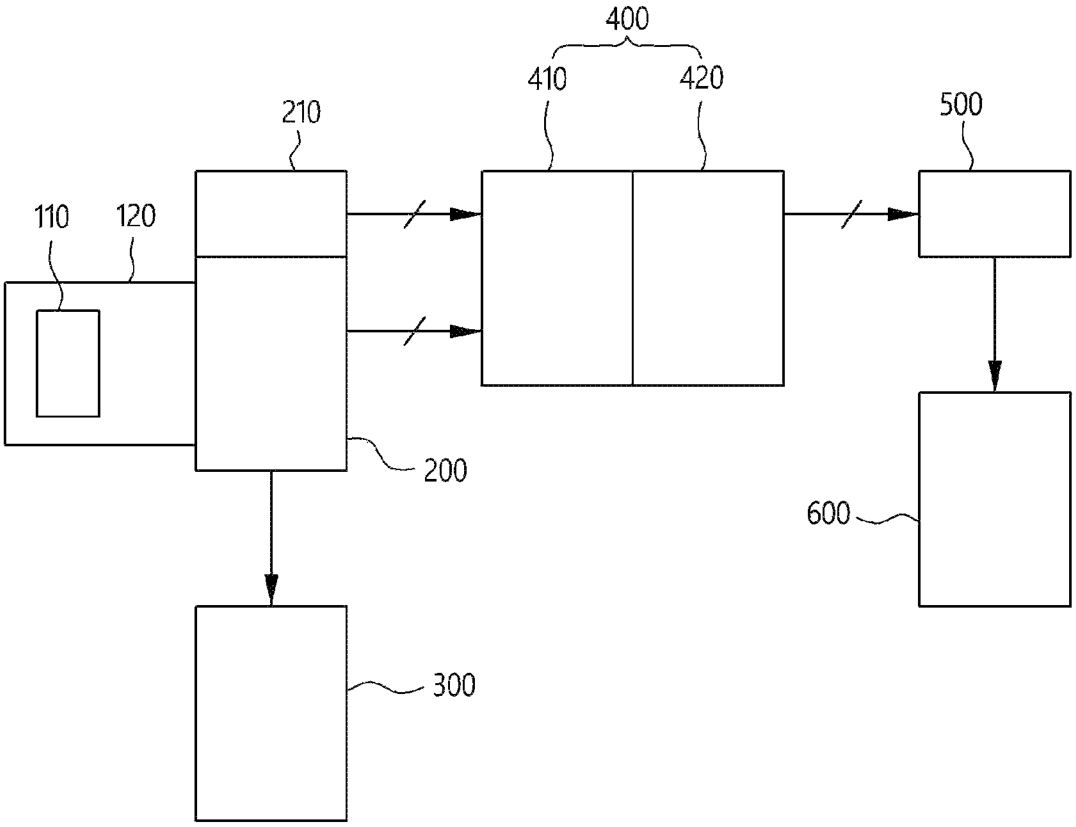
FIG. 4 is a block diagram schematically showing an apparatus for fabricating a display panel according to an embodiment of the present disclosure.

The capacitor CST may be formed between the gate electrode and the source electrode of the driving transistor DTR. The storage capacitor CST stores a voltage difference between the gate voltage and the source voltage of the driving transistor DTR The driving transistor DTR and the first and second transistors STR1 and STR2 may be formed as thin-film transistors. In addition, although FIG. 4 shows that each of the driving transistor DTR and the first and second switching transistors STR1 and STR2 is implemented as an n-type MOSFET (metal oxide semiconductor field effect transistor), it is to be noted that the present disclosure is not limited thereto. That is to say, the driving transistor DTR and the first and second switching transistors STR1 and STR2 may be implemented as p-type MOSFETs, or some of them may be implemented as n-type MOSFETs while the others may be implemented as p-type MOSFETs.

Figure 3:
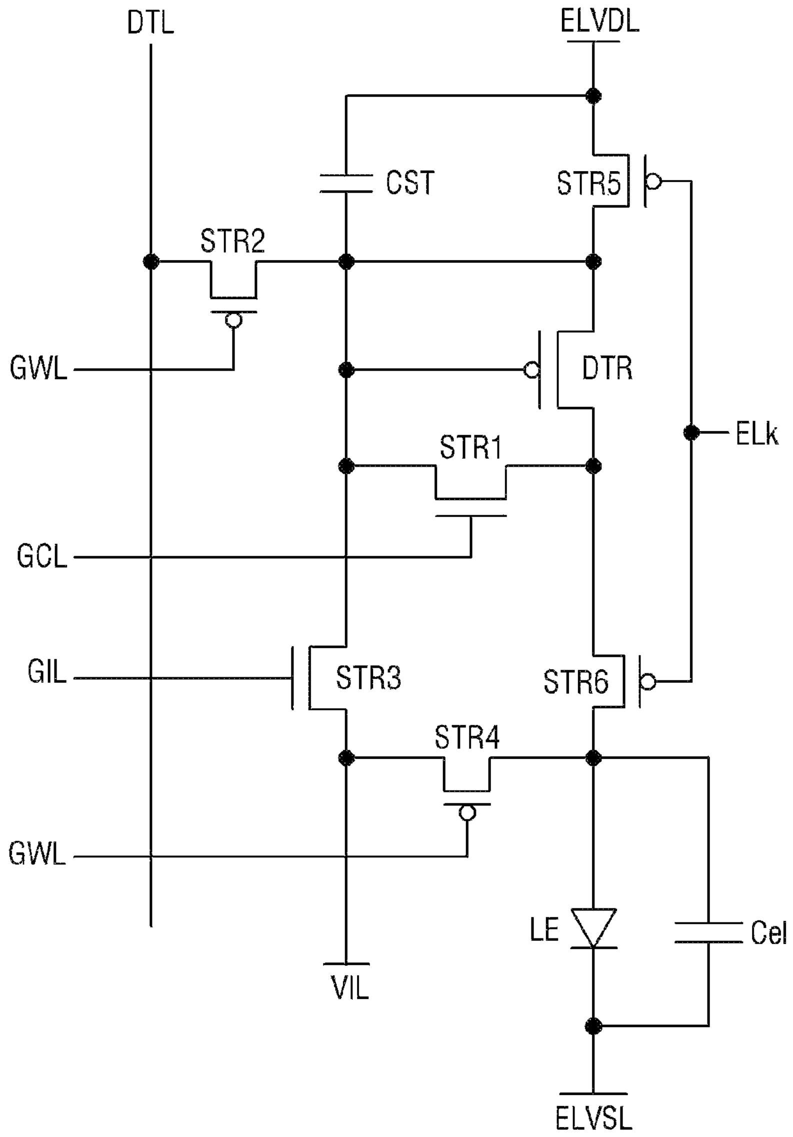
FIG. 3 is an equivalent circuit diagram of each of pixels according to another embodiment of the present disclosure.

FIG. 3 is an equivalent circuit diagram of each of pixels according to another embodiment of the present disclosure.

Referring to FIG. 3, each of the pixels PX may include a plurality of switch elements for driving light-emitting elements LE, a driving transistor DTR, and a capacitor CST. The switch elements may include first to sixth transistors STR1, STR2, STR3, STR4, STR5 and STR6.

The driving transistor DTR includes a gate electrode, a first electrode, and a second electrode. A drain-source current Ids (hereinafter referred to as "driving current") of driving transistor DTR flowing between the first electrode and the second electrode is controlled according to the data voltage applied to the gate electrode.

The capacitor CST is formed between the second electrode of the driving transistor DTR and the second supply voltage line ELVSL. One electrode of the capacitor CST may be connected to the second electrode of the driving transistor DTR while the other electrode thereof may be connected to the second voltage supply line ELVSL.

When the first electrode of each of the first to sixth transistors STR1, STR2, STR3, STR4, STR5 and STR6 and the driving transistor DTR is the source electrode, the second electrode thereof may be the drain electrode. Alternatively, when the first electrode of each of the first to sixth transistors STR1, STR2, STR3, STR4, STR5 and STR6 and the driving transistor DTR is the drain electrode, the second electrode thereof may be the source electrode.

The driving transistor DTR, the second transistor STR2, the fourth transistor STR4, the fifth transistor STR5 and the sixth transistor STR6 may be implemented as p-type MOSFETs while the first transistor STR1 and the third transistor STR3 may be implemented as n-type MOSFETs. Alternatively, the first to sixth transistors STR1, STR2, STR3, STR4, STR5 and STR6 and the driving transistor DTR may be implemented as p-type metal oxide semiconductor field effect transistors ("MOSFETs").

As described above, the driving transistor DTR for driving the light-emitting elements LE, the first and second switching transistors STR1 and STR2, or the first to sixth transistors STR1, STR2, STR3, STR4, STR5 and STR6 may be formed in each of the pixels PX.

In order to form the switching transistors, i.e., the driving transistor DTR and the first and second switching transistors STR1 and STR2, or the first to sixth transistors STR1, STR2, STR3, STR4, STR5 and STR6 appropriately for the display device 10, the display panel formed in the display device 10, the size or material characteristics of the pixels PX, panel characteristics, etc., it is desirable to clearly analyze characteristics and operation characteristic information for each of the switching transistors. Therefore, an apparatus and method of analyzing operation characteristic information of n-type MOSFET (n-channel MOS) transistors and p-type MOSFET (p-channel MOS) transistors having different channel sizes will be described in detail. In the following description, the transistors will be collectively referred to as switching transistors.

FIG. 4 is a block diagram schematically showing an apparatus for fabricating a display panel according to an embodiment of the present disclosure.

Referring to FIG. 4, a sample module 110, a measurement module 120, a characteristic detecting unit 200, a database 210, a first monitoring unit 300, a model learning unit 400, a correction learning unit 500 and a second monitoring unit 600.

At least one switching transistor for detecting operation characteristic information is formed in the sample module 110. A plurality of NMOS or PMOS transistors having different channel sizes may be formed in each sample module 110. Alternatively, a plurality of NMOS and PMOS transistors having different channel sizes may be formed in combination in each sample module 110. In another embodiment, one NMOS transistor and one PMOS transistor may be formed in the sample module 110.

In the display panel of the display device, a plurality of NMOS and PMOS transistors forming the respective pixel driving circuits may be formed in combination. Therefore, by employing the structure of the sample module 110 in which the NMOS and PMOS transistors are formed in combination, the operation characteristics of the NMOS and PMOS transistors can be more accurately detected. According to the channel sizes of the switching transistors formed in the sample module 110, the operation characteristic information of each of the switching transistors, such as output current, output voltage, and threshold voltage range, may be changed. Herein, the operation characteristic information of the switching transistors may include the voltage output from the drain electrode, the range of voltage output from the drain electrode, the amount of current output from the drain electrode, and the threshold voltage range of the switching transistors.

The sample module 110 is loaded into a loading portion of the measurement module 120. The gate electrode, the source electrode and the drain electrode of each of the switching transistors formed in the sample module 110 are electrically connected to the input/output terminals of the measurement module 120. In an embodiment, for example, first to third input/output terminals of the measurement module 120 may be connected to the gate electrode, the source electrode and the drain electrode of each of the switching transistors of the sample module 110 through connection lines, respectively (See FIG. 5). Specifically, the measurement module 120 provides a first driving voltage input from the characteristic detecting unit 200 at the first input/output terminal to the source electrode of a switching transistor in the sample module 110. In addition, the measurement module 120 may provide a second driving voltage input from the characteristic detecting unit 200 at the second input/output terminal to the gate electrode of the switching transistor in the sample module 110. On the other hand, the measurement module 120 may transfer the drain voltage output from the drain electrode of the switching transistor in the sample module 110 at the third input/output terminal to the characteristic detecting unit 200.

The characteristic detecting unit 200 detects operation characteristic information including the voltage output from the drain electrode, the range of the voltage output from the drain electrode, the amount of current output from the drain electrode, and the threshold voltage range of the switching transistor. To this end, the characteristic detecting unit 200 provides a source voltage having a predetermined level to the source electrode of the switching transistor in the sample module 110 through the first input/output terminal of the measurement module 120. In addition, the characteristic detecting unit 200 provides agate voltage varying within a predetermined voltage range to the gate electrode of the switching transistor in the sample module 110 through the second input/output terminal of the measurement module 120. Besides, the characteristic detecting unit 200 detects the drain voltage output from the drain electrode of the switching transistor in the sample module 110 through the third input/output terminal of the measurement module 120. Accordingly, the characteristic detecting unit 200 cumulatively detects changes in the level of the drain voltage output from the drain electrode of the switching transistor in the sample module 110 relative to the level of the source voltage and the variable range of the gate voltage, to detect operation characteristic information of the switching transistor in the sample module 110.

The characteristic detecting unit 200 transmits the operation characteristic information for each switching transistor formed in each sample module 110 to the database 210 and shares it with the database 210. In an embodiment, the database 210 stores the operation characteristic information for each of the switching transistors formed in each sample module 110, and creates a database according to a list of predetermined classifications such as the types (NMOS or PMOS) of the switching transistors for each sample module 110, channel size, applied panel model, etc.

In an embodiment, the first monitoring unit 300 displays real-time operation characteristic information such as a change in the amount of output current, a change in the output voltage and the threshold voltage range of the switching transistors for each sample module 110 as images or graphics on the monitor. In addition, the first monitoring unit 300 may display the operation characteristic information of switching transistors created as the database according to the list of classifications, such as types of switching transistors, the channel size, and the applied panel model, as images or graphics on the monitor.

The model learning unit 400 uses one or more learning models 410 and 420 and a learning program of the learning models 410 and 420 to learn the operation characteristic information on the switching transistors of the sample module 110, including encoding, decoding, compression and interpolation processes, and extracts learning result data interpolated with operation characteristics information.

In an embodiment, the model learning unit 400 may apply the predetermined list of classifications and classification information, such as channel types of switching transistors, channel sizes, applied panel model information, etc., as primary learning parameters of the learning program. The model learning unit 400 performs learning by using the source voltage value, the gate voltage value, the variable range of the gate voltage, the voltage output from the drain electrode, the output current, the threshold voltage range, etc. of the switching transistors detected by the characteristic detecting unit 200 as input values (or variables) for the learning program. As the learning process using the learning program, processes such as encoding, decoding, compression and interpolation may be performed.

The model learning unit 400 may input the detected values sampled from the characteristic detecting unit 200, for example, the sampled source voltage value, gate voltage value, output voltage value of the drain electrode and output current value as input values of the learning program to perform the primary learning, and may extract the learning result data obtained by interpolating the operation characteristic information on the switching transistors.

In an embodiment, for example, the model learning unit 400 may perform learning by receiving the variable range of the gate voltage and threshold voltage range as input values for the primary learning model 410 in addition to the source voltage value, the gate voltage value, the voltage output from the drain electrode, the output current sampled from the characteristic detecting unit 200 to perform learning with the learning program of the primary learning model 410. In doing so, since the operation characteristic information on the switching transistor is refined and interpolated according to the program for the primary learning model 410, the primary operation characteristic information larger than the sampled input values may be extracted as primary learning result data.

The model learning unit 400 may perform the secondary learning program using cumulative operation characteristic information on the switching transistors as input values for secondary learning model 420, in addition to the results of the primary learning, i.e., the interpolated primary operation characteristic information on the switching transistors and primary learning parameters. The model learning unit 400 may extract the secondary operation characteristic information on the switching transistors as secondary learning result data according to the learning program of the secondary learning model 420. In an embodiment, processes such as encoding, decoding, compression and interpolation may be additionally performed as the learning process of the secondary learning model 420.

The correction learning unit 500 establishes a database containing the primary operation characteristic information extracted through the primary learning program, that is, the interpolated learning result data by the fabrication characteristics of the switching transistors and the list of classifications. In addition, the correction learning unit 500 may compare the primary operation characteristic information extracted through the primary learning program with the secondary operation characteristic information extracted through the secondary learning program, and may correct the parameter data or parameter input values of the primary or secondary learning program based on the comparison results. In an embodiment, for example, the correction learning unit 500 may correct the source voltage, the gate voltage and the variable range of the gate voltage of the switching transistors input to the first or secondary learning program so that the difference between the first operation characteristic information and the second operation characteristic information is minimized.

The second monitoring unit 600 may display the primary and secondary learning result data extracted as result data by the model learning unit 400, the primary and secondary operation characteristic information, the parameter information corrected by the correction learning unit 500, etc. as the images or graphics on the monitor.

Figure 5:
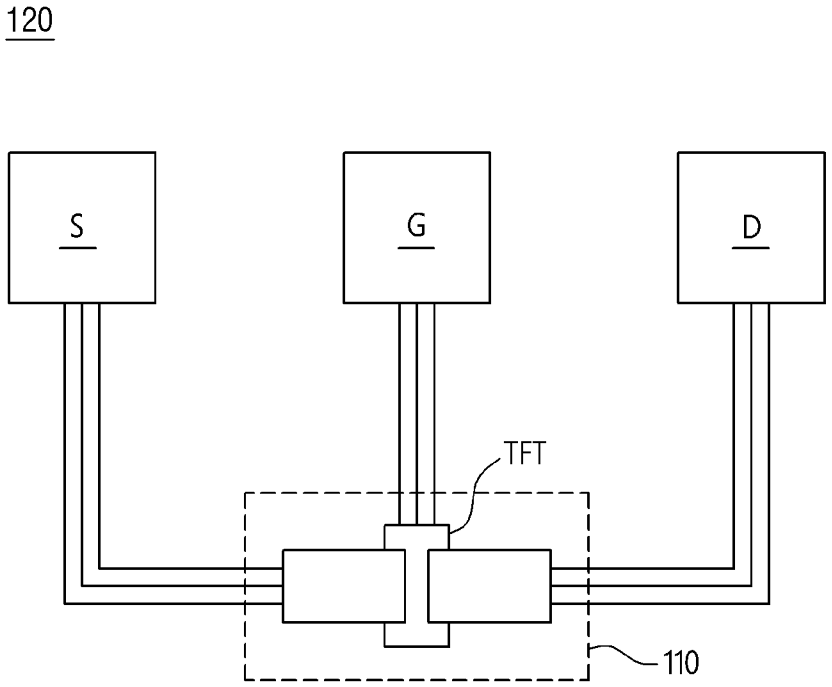
FIG. 5 is a block diagram showing the sample module of transistors and the measurement module of FIG. 4.

FIG. 5 is a block diagram showing the sample module of transistors and the measurement module of FIG. 4.

Referring to FIG. 5, at least one switching transistor TFT for detecting operation characteristic information is formed in the sample module 110. A plurality of NMOS or PMOS transistors having different channel sizes may be formed in each sample module 110, or one NMOS transistor and one PMOS transistor may be formed in the sample module 110. Hereinafter, an example in which an NMOS transistor is formed in the sample module 110 will be described.

The sample module 110 is loaded into the loading portion of the measurement module 120. The gate electrode, the source electrode and the drain electrode of the switching transistor TFT formed in the sample module 110 are electrically connected to the first to third input/output terminals S, G and D of the measurement module 120, respectively. In an embodiment, for example, the first to third input/output terminals S, G and D of the measurement module 120 may be connected to the gate electrode, the source electrode and the drain electrode of each of the switching transistors of the sample module 110 through connection lines, respectively.

The measurement module 120 may provide the first driving voltage input from the characteristic detecting unit 200 at the first input/output terminal S to the source electrode of the switching transistor TFT as a source voltage. In addition, the measurement module 120 may provide a second driving voltage input from the characteristic detecting unit 200 at the second input/output terminal G to the gate electrode of the switching transistor TFT. On the other hand, the measurement module 120 may transfer the drain voltage output from the drain electrode of the switching transistor TFT at the third input/output terminal D to the characteristic detecting unit 200.

Figure 6:
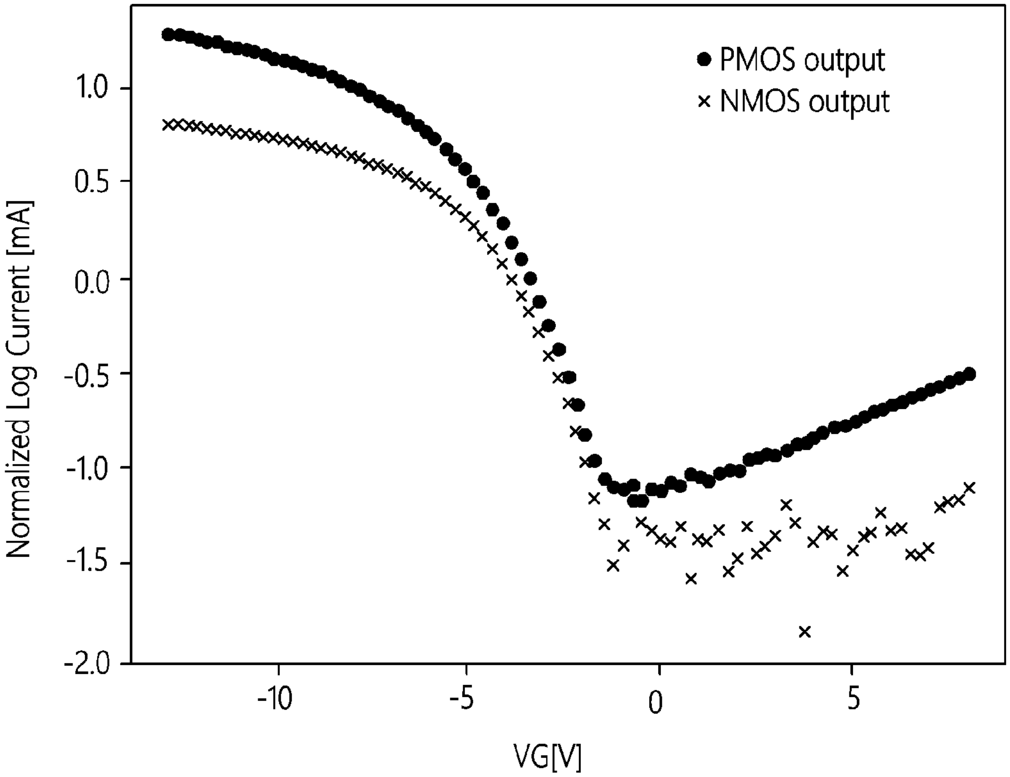
FIG. 6 is a graph showing the output voltage and threshold voltage characteristics of the switching transistors detected by the feature detecting unit of FIG. 4.

FIG. 6 is a graph showing the output voltage and threshold voltage characteristics of the switching transistors detected by the characteristic detecting unit of FIG. 4.

Referring to FIG. 6, the characteristic detecting unit 200 provides a source voltage to the source electrode of a switching transistor TFT through the first input/output terminal S of the measurement module 120. In addition, the characteristic detecting unit 200 may provide a gate voltage to the gate electrode of the switching transistor TFT through the second input/output terminal G of the measurement module 120.

TABLE 1

| | Source(S) | Gate(G) | Drain(D) | |
|---|---|---|---|---|
| pMOS | Common | 8 V~−13 V | −0.1 V | −5.1 V |
| nMOS | Common | −8 V~13 V | 0.1 V | 5.1 V |

Referring to Table 1, in detecting the operation characteristic information of the PMOS transistor, the characteristic detecting unit 200 may provide the common voltage of approximately 5V as a source voltage to the source electrode of the switching transistor TFT through the first input/output terminal S of the measurement module 120. In addition, the characteristic detecting unit 200 may provide a gate voltage varying in the range of approximately 8 V to −13 V to the gate electrode of the switching transistor TFT through the second input/output terminal G of the measurement module 120.

Accordingly, as shown in FIG. 6, the characteristic detecting unit 200 may detect the drain voltage characteristic output from the drain electrode of the switching transistor TFT to the third input/output terminal D. As the drain electrode of the PMOS transistor, a drain voltage varying from approximately −10 V to 5 V may be detected. In particular, a range between approximately −0.1 V and −5.1 V may be the threshold voltage range of the PMOS transistor, approximately −0.1 V or more may be the turn-off range, and approximately −5.1 V or less may be detected as the turn-on range.

On the other hand, in detecting the operation characteristic information of the NMOS transistor, the characteristic detecting unit 200 may provide the common voltage of approximately 5V as a source voltage to the source electrode of the switching transistor TFT of the measurement module 120. In addition, the characteristic detecting unit 200 may provide a gate voltage varying in the range of approximately −8 V to 13 V to the gate electrode of the switching transistor TFT through the second input/output terminal G of the measurement module 120.

Accordingly, as shown in FIG. 6, the characteristic detecting unit 200 may detect the drain voltage characteristic output from the drain electrode of the switching transistor TFT to the third input/output terminal D. As the drain electrode of the NMOS transistor, a drain voltage varying from approximately −10 V to 5 V may be detected. In particular, a range between approximately −0.1 V and −5.1 V may be the threshold voltage range of the NMOS transistor, approximately −0.1 V or more may be the turn-off range, and approximately −5.1 V or less may be detected as the turn-on range.

It can be seen from FIG. 6 that the noise of the detected drain voltages increases in the low-level voltage range in which the amount of current is lowered to −1.0 milliamperes (mA) or less. Therefore, even if the voltage at the drain electrode and the amount of current are lowered to the low-level range, the output characteristics of the drain electrode should be more clearly checked by ignoring or removing noise.

Figure 7:
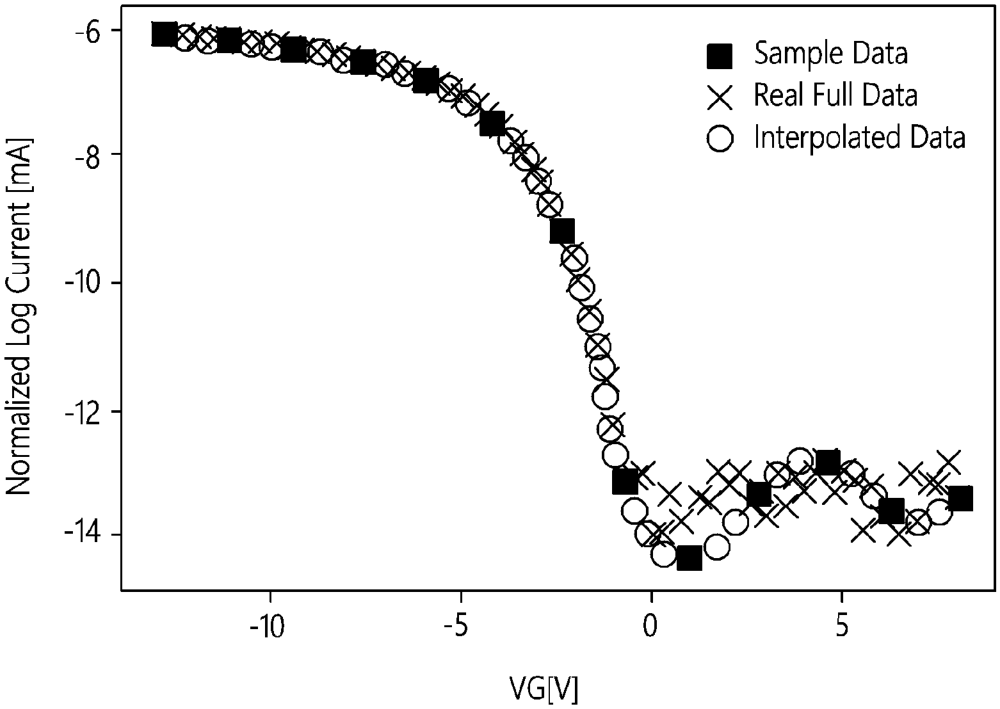
FIG. 7 is a graph showing the output voltage and interpolated voltage characteristics of the switching transistor sampled in the characteristic detecting unit of FIG. 4.

FIG. 7 is a graph showing the output voltage and interpolated voltage characteristics of the switching transistor sampled in the characteristic detecting unit of FIG. 4.

Referring to FIG. 7, in detecting the operation feature information of the PMOS transistor, the feature detecting unit 200 may provide the common voltage of approximately 5V as a source voltage to the source electrode of the switching transistor TFT through the first input/output terminal S of the measurement module 120. In addition, the characteristic detecting unit 200 may provide a gate voltage varying in the range of approximately 8 V to −13 V to the gate electrode of the switching transistor TFT through the second input/output terminal G of the measurement module 120. Accordingly, as shown in FIG. 7, the characteristic detecting unit 200 may detect the drain voltage characteristic output from the drain electrode of the switching transistor TFT to the third input/output terminal D as a whole to extract the total detected value (Real Full Data).

On the other hand, the characteristic detecting unit 200 may sample the drain voltage characteristic of the drain electrode by sampling and detecting the drain voltage output from the drain electrode of the PMOS transistor every sampling period. When the drain voltage output from the drain electrode is sampled, the capacity for drain voltage sample values (Sample Data) is reduced, thereby reducing input values of the learning program and shortening the learning time.

On the other hand, the characteristic detecting unit 200 detects the drain voltage output from the drain electrode of the PMOS transistor every predetermined sampling period, and interpolates the drain voltage sample value to calculate the interpolated data. In doing so, the characteristic detecting unit 200 may calculate the interpolated data of the drain voltage by interpolating the values between the drain voltage sample values.

Figure 8:
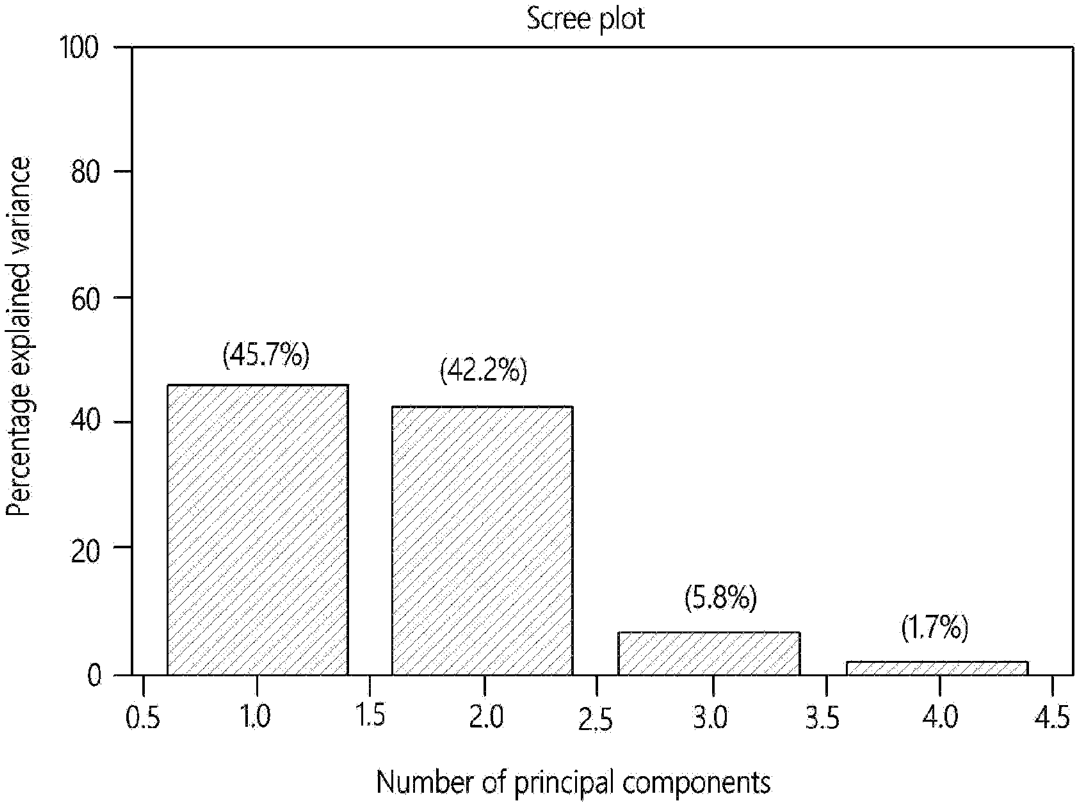
FIG. 8 is a graph showing the distribution of output voltage of the switching transistor detected in the characteristic detecting unit of FIG. 4.

FIG. 8 is a graph showing the distribution of output voltage of the switching transistor detected in the characteristic detecting unit of FIG. 4.

By analyzing the total drain voltage detection value output from the drain electrode with reference to FIG. 8, a voltage value of approximately 45.7% is detected in the turn-on voltage range of the switching transistor and a voltage value of approximately 42.2% is detected in the turn-off voltage range. On the other hand, it can be seen that a voltage value of around 5.8% is detected in the threshold voltage range, which should be detected most importantly.

The detected drain voltages in the turn-on voltage range and the turn-off voltage range may overlap somewhat in a range of approximately 42% to 45%. Accordingly, the accuracy can be increased by applying the voltage values of around 5.8% included in the threshold voltage range as main parameters and using them in a model learning program, such as encoding and decoding.

Figure 9:
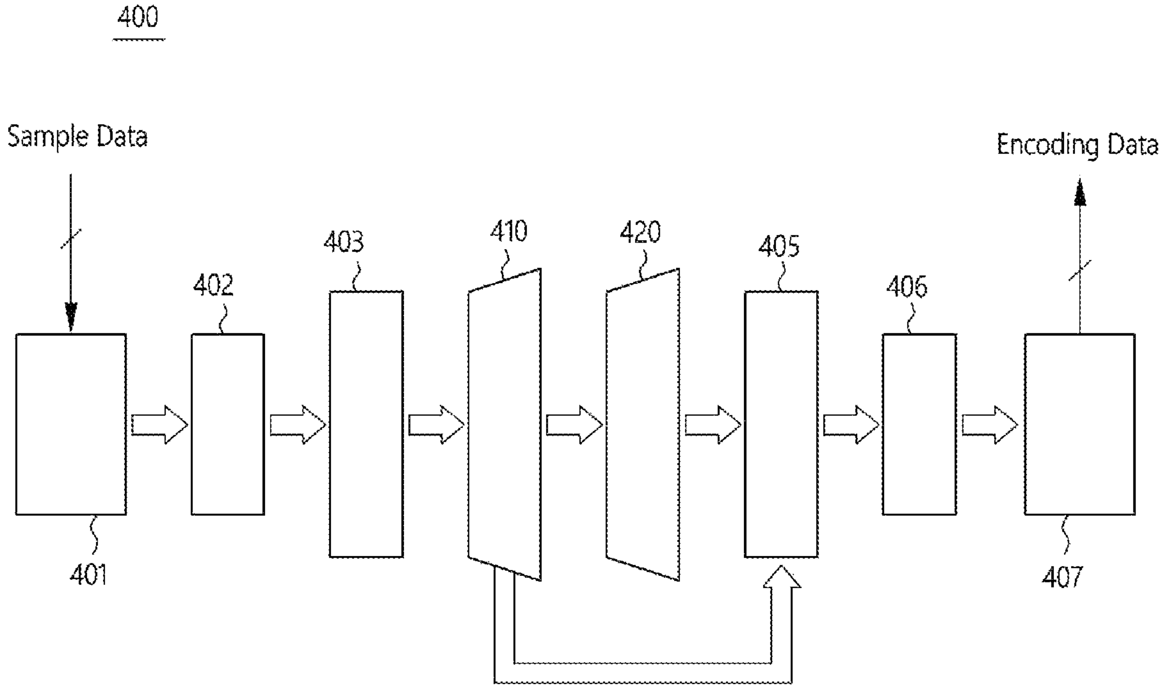
FIG. 9 is a block diagram showing the model learning unit shown in FIG. 4 in detail.

FIG. 9 is a block diagram showing the model learning unit shown in FIG. 4 in detail.

Referring to FIG. 9, the model learning unit 400 includes a parameter input 401, a first bit converter 402, a first data aligner 403, a primary learning model 410, a secondary learning model. 420, a second data aligner 405, a second bit converter 406, and a learning data output 407.

In an embodiment, the parameter input 401 receives format information of classification information, such as the channel type of the switching transistor, the channel size and applied panel model information, as respective parameter data. In addition, the parameter input 401 stores the information on the source voltage value, the gate voltage value, the variable range of the gate voltage, the sampled voltage output from the drain electrode, the output current, the threshold voltage range of the switching transistors detected by the characteristic detecting unit 200 as input values (or variables). In particular, the parameter input 401 may not receive the total drain voltage value output from the drain electrode of the switching transistor as an output voltage value but may receive the output voltage value sampled from the characteristic detecting unit 200 as sample data. The parameter input 401 may also sequentially store information on the output current amount and threshold voltage range of the drain electrode, including sample data with a small capacity.

The first bit converter 402 converts input values including parameter data and sample data input to the parameter input 401 into predetermined bit units based on a learning model. In an embodiment, for example, the first bit converter 402 may convert all of the input values such as parameter data and sample data into data of a predetermined 10-bit format.

The first data aligner 403 aligns the input values such as parameter data and sample data converted into the predetermined bit unit according to normalization information of a pre-programmed learning model and stores them as respective variables. In an embodiment, for example, the first data aligner 403 may classify and align the input values such as parameter data and sample data according to a list of classifications such as voltage, current, and variable range of voltage.

In an embodiment, the primary learning model 410 runs a primary learning program using the input values such as parameter data and sample data as variables of the predetermined learning model. Then, the primary learning model 410 interpolates the sampled output voltage of the drain electrode according to the learning results, and extracts primary operation characteristic information including the interpolated output voltage values of the drain electrode and the threshold voltage range as primary learning result data.

Specifically, the primary learning model 410 may encode and compress the input values such as parameter data and sample data aligned as the respective variables according to the learning program and decode and interpolate them again, so that the primary operation characteristic information with the interpolated output voltage values of the drain electrode. In doing so, since noises belong to a value or are removed in the process of encoding, compressing and decoding the sampled output voltage values of the drain electrode, the noises on the voltage values included in the low-level range of 0 V or less can be somewhat removed. Accordingly, the primary learning model 410 may extract the output voltage values of the drain electrode from which noises are removed in the low-level range as the primary operation characteristic information.

The secondary learning model 420 runs secondary learning program by using the cumulative operation characteristic information of the switching transistors accumulated during the process of detecting the primary operation characteristic information and the most recent primary operation characteristic information as variables for the predetermined learning model. In addition, as a result of the secondary learning, the secondary learning model 420 extracts secondary operation characteristic information in which the output voltage values of the drain electrode and the threshold voltage range are corrected as the secondary learning result data.

In an embodiment, for example, the secondary learning model 420 reads cumulative operation characteristic information for the drain output voltage value and current amount, and threshold voltage range of switching transistors accumulated during the process of detecting the primary operation characteristic information from a memory or the database 210, and use it as cumulative variables. Accordingly, the secondary learning model 420 runs a secondary learning program using the cumulative variables and the primary operation characteristic information extracted from the primary learning model 410 as the variables. The secondary learning model 420 may substitute the output voltage values, current values, etc. in a similar range with the same value or with average value to compress the overall data, and may remove noises as well. Then, the secondary learning model 420 may extract the output voltage values of the drain electrode and the threshold voltage range decompressed after compression as secondary operation characteristic information.

The second data aligner 405 aligns the parameter data and input values applied in extracting the primary operation characteristic or secondary operation characteristic information according to the predetermined list of classifications and normalization information to output them. The second data aligner 405 may align the parameter data and the input values included in the primary or secondary operation characteristic information appropriately for the output data format of the second monitoring unit 600 or the format for each output port, to output them.

The second bit converter 406 converts the parameter data and the input values aligned in the second data aligner 405 into a predetermined bit unit for each output port. In doing so, the second bit converter 406 may perform opposite operation to the first bit converter 402.

The learning data output 407 may output the primary learning result data containing the primary operation characteristic information or the secondary learning result data containing the secondary operation characteristic information as the final result data (Encoding Date) according to the predetermined list and the normalization information.

Figure 10:
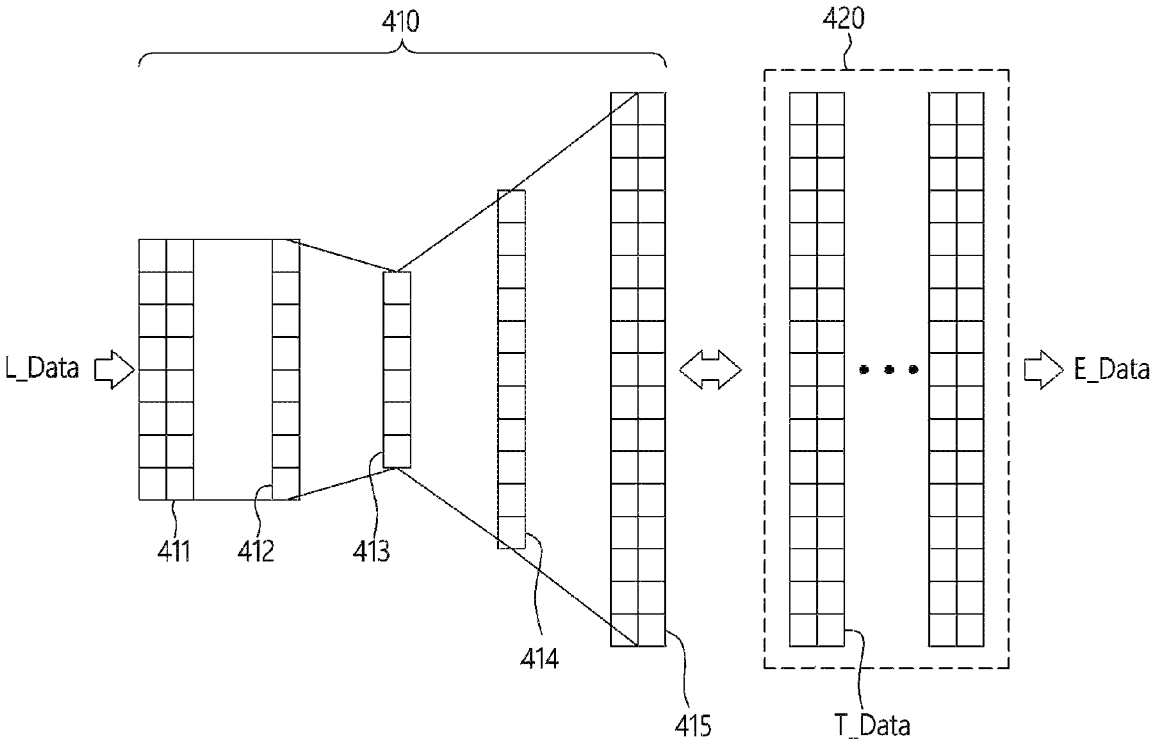
FIG. 10 is a block diagram showing learning steps of a data conversion process of the primary and secondary learning models shown in FIG. 9.

FIG. 10 is a block diagram showing learning steps of a data conversion process of the primary and secondary learning models shown in FIG. 9.

Referring to FIG. 10, the primary learning model 410 includes a variable input portion 411, an encoding learning portion 412, a data learning portion 413, a decoding learning portion 414, and an interpolation learning portion 415.

In an embodiment, the variable input portion 411 stores the input values L_Data such as the parameter data and sample data input from the first data aligner 403 as parameter data and variables for the primary learning program.

Figure 11:
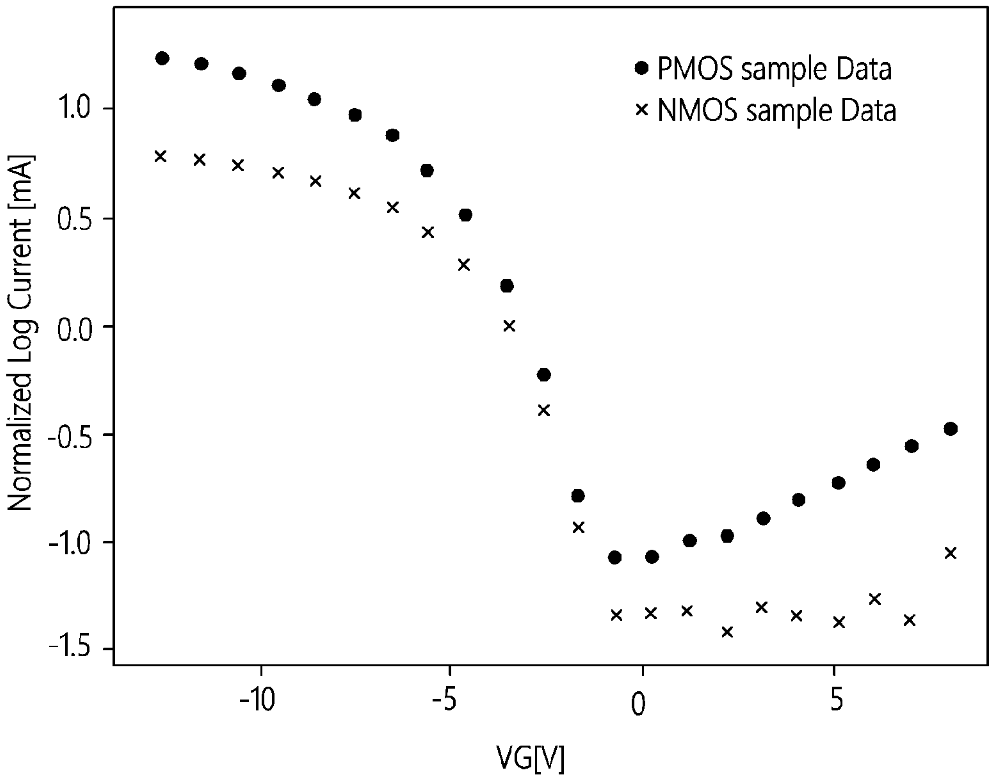
FIG. 11 is a graph showing voltage output values of sample data input to the variable input portion of FIG. 10.

FIG. 11 is a graph showing voltage output values of sample data input to the variable input portion of FIG. 10.

As shown in FIG. 11, sample data input to the variable input portion 411 includes output voltage values of the drain electrode sampled by the characteristic detecting unit 200.

In an embodiment, the encoding learning portion 412 encodes the input values L_Data such as sample data by classifying them by each parameter data. In particular, the encoding learning portion 412, in the encoding process through an encoding program, the output voltage values in a similar range included in the sample data belong to the same value or are substituted with the average value, to compress sample data to remove noise. In doing so, the output voltage values in similar range for belonging to a value or being substituted may be pre-programmed or set by the encoding program.

The data learning portion 413 classify the data encoded by the encoding learning portion 412, for example, input voltage values and current values by a list of classifications of parameter data. In addition, the data learning portion 413 sequentially compares the input voltage values and current values that are aligned adjacent to each other, performs loss compression that has the values within a similar range belong to a value based on the comparison results, and stores it in a predetermined latent space. By having the input voltage and current values for each list of classifications of parameters data belong to certain values, the amount of data can be reduced while further removing the noise belonging to certain values.

The decoding learning portion 414 decodes the input voltage values and current values stored in the latent space of the data learning portion 413 according to the list of classifications of parameter data, and separate the output voltage values of the drain electrode and decode and output them.

Figure 12:
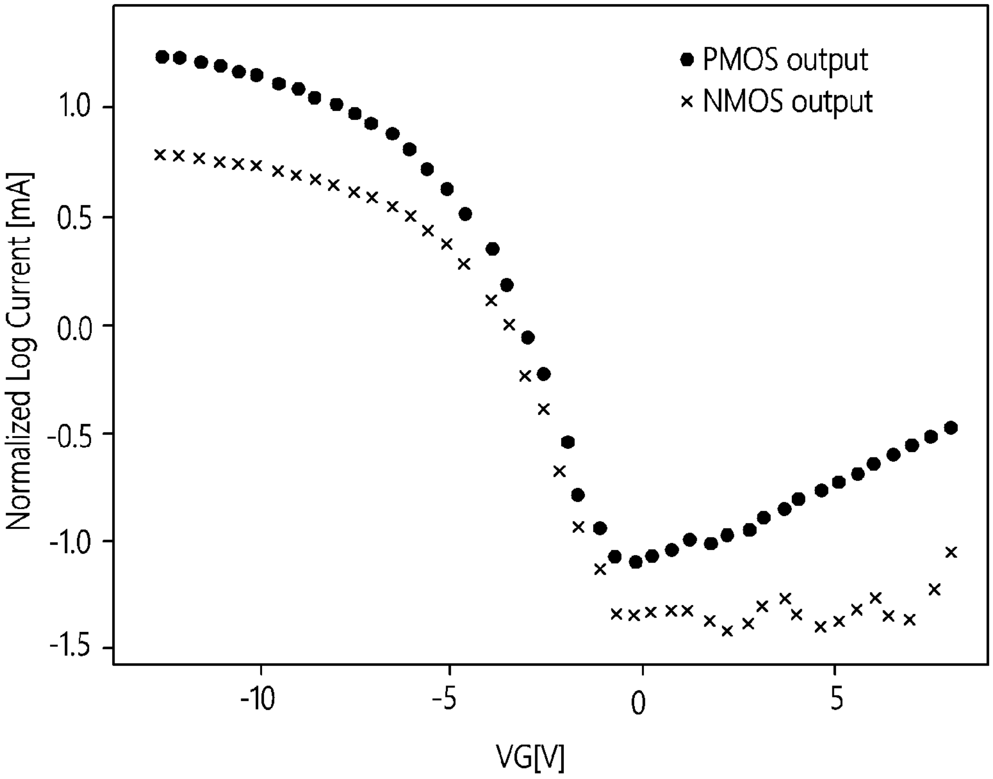
FIG. 12 is a graph showing the output values of the drain electrode interpolated in the interpolation learning portion of FIG. 10.

FIG. 12 is a graph showing the output values of the drain electrode interpolated in the interpolation learning portion of FIG. 10.

Referring to FIG. 12, the interpolation learning portion 415 extracts the values between the output voltage values of the drain electrode output from the decoding learning portion 414, and interpolates the values between them between the output voltage values of the drain electrode. In addition, the interpolation learning portion 415 extracts the primary operation characteristic information including the interpolated output voltage values of the drain electrode and the threshold voltage range as the primary learning result data.

Figure 13:
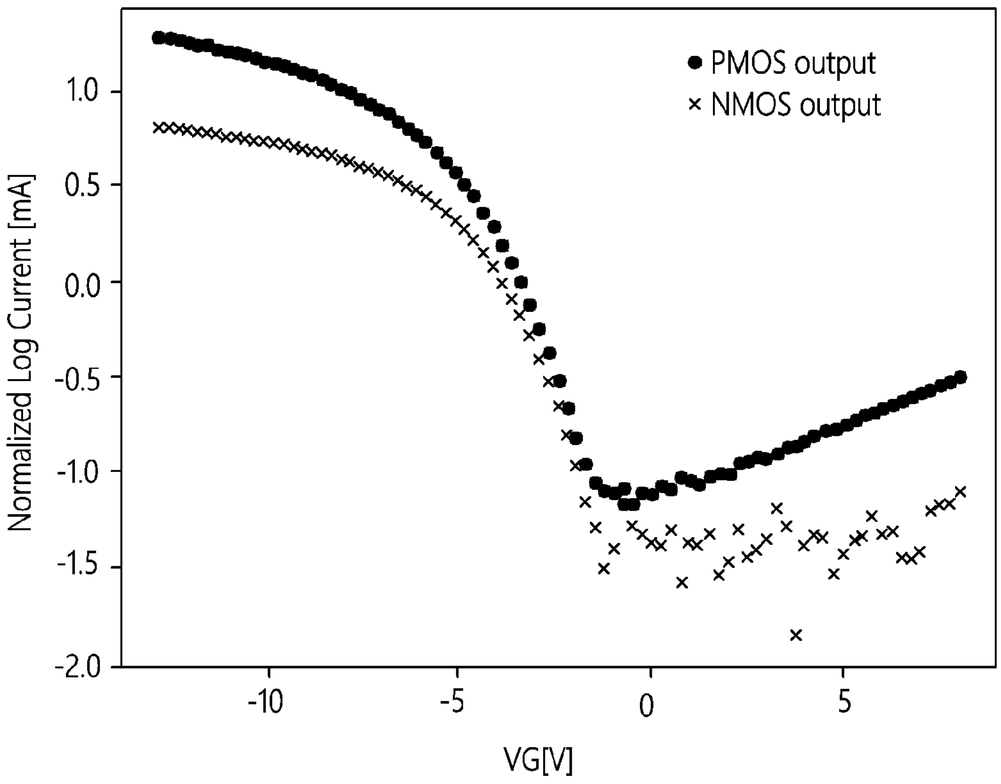
FIG. 13 is a graph showing the accumulated drain electrode output voltage values of the switching transistors read in the second learning model of FIG. 10.

FIG. 13 is a graph showing the accumulated drain electrode output voltage values of the switching transistors read in the secondary learning model of FIG. 10.

Referring to FIG. 13 in conjunction with FIG. 12, the secondary learning model 420 reads cumulative operation characteristic information T_Data of the drain electrode output voltage values, current value (or current amount), and the threshold voltage range information of the switching transistors accumulated as a result of the detection of the primary operation characteristic information, and sets them as cumulative variables. Subsequently, the secondary learning model 420 runs a secondary learning program using the cumulative variables and the primary operation characteristic information extracted from the primary learning model 410 as the variables.

Figure 14:
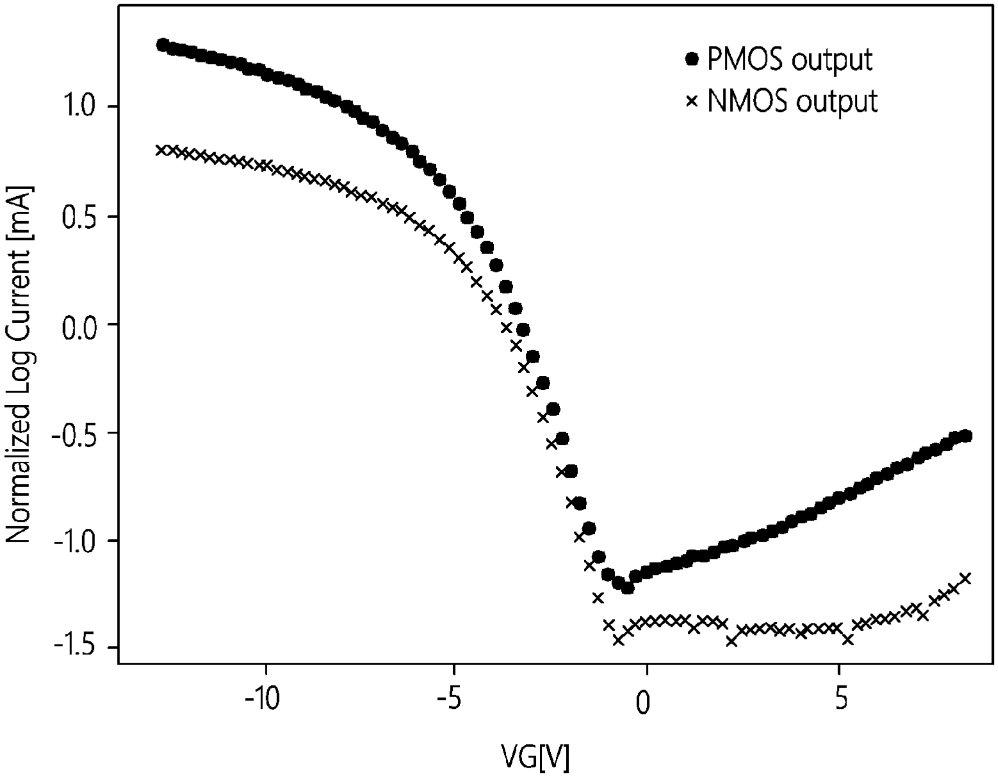
FIG. 14 is a graph showing the output voltage values of the drain electrode, which is finally recovered and output from the secondary learning model.

FIG. 14 is a graph showing the output voltage values of the drain electrode, which is finally decompressed and output from the secondary learning model.

Referring to FIG. 14, the secondary learning model 420 may have the output voltage value, current value, etc. in a similar range belong to the same value or substitute it with the average value, and may output the output voltage values of the drain electrode and threshold voltage range as the secondary operation characteristic information decompressed again after compression.

The secondary learning model 420 may have the output voltage values, current values, etc. in a similar range belong to the same value or substitute them with the average value, to remove noise and extract the finally interpolated learning result data.

As a result, the model learning unit 400 according to the embodiment can remove noise in the output voltage values using the deep learning model, and can detect accurately driving characteristics such as output voltage values and the threshold voltage range of the switching transistors formed in the display panel. In particular, it is possible to simply and easily detect the driving characteristics of the switching transistors with the sampled measurement values, and it is possible to create a database of the driving characteristics of the switching transistors which are accurate for the unique characteristics of the switching transistors.

As used in connection with various embodiments of the disclosure, the term “module/unit” may include a unit implemented in hardware, software, or firmware, and may be interchangeably used with other terms, for example, “logic,” “logic block,” “part,” or “circuitry”. For example, a module may be a single integral component, or a minimum unit or part thereof, adapted to perform one or more functions. For example, according to an embodiment of the disclosure, the module may be implemented in a form of an application-specific integrated circuit (ASIC).

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. An apparatus for fabricating a display panel, the apparatus comprising:

a sample module in which a switching transistor is formed;

a measurement module having input/output terminals electrically connected to the switching transistor of the sample module;

a characteristic detecting unit configured to detect primary operation characteristic information comprising an output current, an output voltage value and a threshold voltage range of the switching transistor;

a model learning unit configured to correct at least one of the output current, the output voltage value and the threshold voltage range in the primary operation characteristic information using a learning program comprised in at least one learning model, and to extract correction results as learning result data;

wherein the model learning unit comprises:

a parameter input configured to receive channel type, channel size of the switching transistor, and applied panel model information as respective parameter data, and store a source voltage value, a gate voltage value, a variable range of gate voltage of the switching transistor, a sampled output voltage value of the drain electrode, output current, threshold voltage range information as variables;

a first bit converter configured to convert the parameter data and the variables into a predetermined bit unit according to the learning model; and a correction learning unit configured to classify the learning result data containing the primary operation characteristic information according to fabrication characteristics of sample switching transistors and a list of classifications;

wherein the display panel is formed of a plurality of switching transistors coupled to light-emitting elements in which the plurality of switching transistors are based on the fabrication characteristics of the sample switching transistors and the list of classifications.

2. The apparatus of claim 1, further comprising:

a database configured to store the primary operation characteristic information for the switching transistor formed in the sample module, and to create a database of the primary operation characteristic information according to the list of classifications comprising type of the switching transistor, channel size, and applied panel model;

a first monitoring unit configured to display the primary operation characteristic information for each switching transistor as images or graphics on a monitor; and a second monitoring unit configured to, after the primary operation characteristic information is interpolated by encoding, decoding, compression and interpolation process, display correction results of interpolated learning result data and parameter data as graphics.

3. The apparatus of claim 2, wherein the characteristic detecting unit provides a gate voltage with a variable voltage level to a gate electrode of the switching transistor and a source voltage to a source electrode of the switching transistor, and accumulatively detects changes in a level of a drain voltage output from a drain electrode of the switching transistor relative to a level of the source voltage and a variable range of the gate voltage to detect the primary operation characteristic information containing drain voltage values.

4. The apparatus of claim 3, wherein the model learning unit applies a predetermined list of classifications and classification information containing the channel type and channel size of the switching transistor, and applied panel model information as primary learning parameters of the learning program, and performs the learning program of the primary learning model comprising the encoding, the decoding, the compression and the interpolation process using the source voltage value of the switching transistor, the gate voltage value, the variable range of the gate voltage, the output voltage value of the drain electrode, the output current, and the threshold voltage range as variables.

5. The apparatus of claim 4, wherein the model learning unit performs a secondary learning program using the primary operation characteristic information interpolated according to the results of the first learning program, the primary learning parameters, cumulative operation characteristic information of the switching transistor as variables for the secondary learning program, and outputs the secondary operation characteristic information on the switching transistor derived by a learning program of a secondary learning model of the least one learning model as secondary learning result data.

6. The apparatus of claim 5, wherein the correction learning unit compares the first operation characteristic information extracted by running a learning program of the first learning model with the second operation characteristic information extracted by running the secondary learning program, and corrects parameter data or parameter input values of the primary or secondary learning program according to comparison results.

7. The apparatus of claim 5, wherein the correction learning unit compares the first operation characteristic information extracted through the learning program of a primary learning model of the at least one learning model with the secondary operation characteristic information extracted through the secondary learning program, and corrects the source voltage value, the gate voltage value, the variable range of gate voltage of the switching transistor input to the primary or secondary learning program so that a difference between the primary operation characteristic information and the secondary operation characteristic information is reduced based on comparison results.

8. The apparatus of claim 3, wherein the model learning unit uses a source voltage value of the switching transistor, a gate voltage value of the switching transistor, a variable range of gate voltage, an output voltage value of the drain electrode, an output current and a threshold voltage range sampled from the characteristic detecting unit as variables, to perform a learning program of a primary learning model including encoding, decoding, compression and interpolation process.

9. The apparatus of claim 3, wherein the model learning unit comprises:

a first data aligner configured to align the parameter data and variables converted into bits according to normalization information of each learning model;

a primary learning model configured to perform primary learning with a primary learning program and extract the primary operation characteristic information containing output voltage values and threshold voltage range of the switching transistor as primary learning result data; and a secondary learning model configured to perform secondary learning with a secondary learning program to extract secondary operation characteristic information with corrected output voltage values and threshold voltage range as secondary learning result data.

10. The apparatus of claim 9, wherein the primary learning model uses the parameter data and the variables to perform learning with the learning program of the primary learning model containing the encoding, the decoding, the compression and the interpolation process, and interpolates the sampled output voltage values of the drain electrode to extract the primary operation characteristic information containing the interpolated output voltage values of the drain electrode and threshold voltage range as the primary learning result data.

11. The apparatus of claim 10, wherein the primary first learning model comprises:

a variable input portion configured to store variables comprising the parameter data and the sampled output voltage values of the drain electrode as variables for the primary learning program;

an encoding learning portion configured to encode the variables separately for each parameter data;

a data learning portion configured to compares the input voltage values and current values contained in the encoded variables sequentially, perform loss compression that has the values in a similar range belong to certain values based on comparison results, and store them in a predetermined latent space;

a decoding learning portion configured to decode the input voltage values and current values stored in the latent space according to a list of classifications of the parameter data, and decode to output the output voltage values of the drain electrode separately; and an interpolation learning portion configured to extracting values between the output voltage values of the drain electrode output from the decoding learning unit, interpolate the values between the output voltage values of the drain electrode, and extract the primary operation characteristic information containing the interpolated output voltage values of the drain electrode and threshold voltage range as the primary learning result data.

12. The apparatus of claim 10, wherein the secondary learning model reads the output voltage values and current value of the drain electrode, and threshold voltage range information that have been accumulated as a result of the detection of the primary operation characteristic information as cumulative operation characteristic information and sets it as cumulative variables, and uses the cumulative variables and the primary operation characteristic information as variables to perform the secondary learning program.

13. The apparatus of claim 12, wherein the secondary learning model has the output voltage values and the current values in a predetermined similar range belong to a same value or substitute them with an average value, compresses and then decompress them, and outputs the decompressed output voltage values of the drain electrode and the threshold voltage range as the secondary operation characteristics information.

14. The apparatus of claim 9, wherein the secondary learning model uses cumulative operation characteristic information on the switching transistor accumulated as a result of the detection of the primary operation characteristic information and the primary operation characteristic information as variables for a predetermined learning model to perform the secondary learning program, and extracts the secondary operation characteristic information in which the output voltage values of the drain electrode and the threshold voltage range are corrected as the secondary learning result data.

15. A method for fabricating a display panel, the method comprising:

forming at least one switching transistor in a sample module;

electrically connecting the at least one switching transistor in the sample module with input/output terminals in a measurement module;

detecting, by a characteristic detecting unit, primary operation characteristic information comprising an output current, an output voltage value and a threshold voltage range of the at least one switching transistor;

using at least one learning program for each learning model in a model learning unit to correct at least one of the output current, the output voltage value and the threshold voltage range in the primary operation characteristic information and extracting correction results as learning result data;

wherein the extracting correction results as the learning result data comprises:

receiving channel type, channel size of each switching transistor, and applied panel model information as respective parameter data, and storing a source voltage value, a gate voltage value, a variable range of gate voltage of each switching transistor, a sampled output voltage value of the drain electrode, output current, threshold voltage range information as variables in a parameter input;

converting the parameter data and the variables into a predetermined bit unit according to the learning model; and classifying, by a correction learning unit, the learning result data obtained by interpolating the primary operation characteristic information according to fabrication characteristics of sample switching transistors and a list of classifications to store the classified learning result data;

wherein the display panel is formed of a plurality of switching transistors coupled to light-emitting elements in which the plurality of switching transistors are based on the fabrication characteristics of the sample switching transistors and the list of classifications.

16. The method of claim 15, further comprising:

storing the primary operation characteristic information for each switching transistor of the at least one switching transistor formed in the sample module, and creating a database of the primary operation characteristic information according to a list of classifications comprising type of each switching transistor, channel size, and applied panel model;

displaying the primary operation characteristic information comprising a change in amount of output current, a change in level of output voltage and threshold voltage range for each switching transistor as images or graphics on a monitor; and displaying correction results of learning result data and parameter data comprising the primary operation characteristic information as graphics.

17. The method of claim 16, wherein the detecting, by the characteristic detecting unit, the primary operation characteristic information comprises:

providing a gate voltage with a variable voltage level to a gate electrode of each switching transistor;

providing a source voltage to a source electrode; and accumulatively detecting changes in a level of a drain voltage output from a drain electrode of each switching transistor relative to a level of the source voltage and a variable range of the gate voltage to detect the primary operation characteristic information containing drain voltage values.

18. The method of claim 16, wherein the extracting the correction results as the learning result data comprises:

applying a predetermined list of classifications and classification information containing the channel type and channel size of each switching transistor, and applied panel model information as primary learning parameters of the learning program, and performing the learning program of the primary learning model comprising the encoding, the decoding, the compression and the interpolation process using the source voltage value of each switching transistor, the gate voltage value, the variable range of the gate voltage, the output voltage value of the drain electrode, the output current, and the threshold voltage range as variables.

19. The method of claim 18, wherein the extracting the correction results as the learning result data further comprises:

performing a second learning program using the primary operation characteristic information interpolated according to the results of the first learning program, the primary learning parameters, cumulative operation characteristic information of each switching transistor as variables for the secondary learning program; and outputting the secondary operation characteristic information on each switching transistor derived by a learning program of the secondary learning model as secondary learning result data.

20. The method of claim 16, wherein the extracting the correction results as the learning result data comprises:

aligning the parameter data and variables converted into bits according to normalization information of each learning model;

performing primary learning with a primary learning program and extracting the primary operation characteristic information containing output voltage values and threshold voltage range of each switching transistor as primary learning result data; and performing second learning with a second learning program to extract secondary operation characteristic information with corrected output voltage values and threshold voltage range as secondary learning result data.

* * * * *